United States Patent [19]

Rosier et al.

[11] Patent Number: 4,737,739

[45] Date of Patent: Apr. 12, 1988

[54] MONOLITHIC FET BRIDGE ATTENUATOR

[75] Inventors: Charles D. Rosier, Melbourne; Donald K. Belcher, West Melbourne; Seward T. Salvage, Palm Bay, all of Fla.

[73] Assignee: Harris Corporation, Melbourne, Fla.

[21] Appl. No.: 914,680

[22] Filed: Oct. 2, 1986

[51] Int. Cl.$^4$ ............................................. H03H 11/24
[52] U.S. Cl. .................................. 333/81 R; 307/568; 333/138
[58] Field of Search ........... 333/81 R, 81 A, 170–172, 333/169; 323/225, 320, 350, 365; 307/549, 550, 567, 568, 490, 497, 501, 571, 584

[56] References Cited

U.S. PATENT DOCUMENTS

| | | | |
|---|---|---|---|
| 3,159,796 | 12/1964 | Van Sandwyk | 323/365 X |
| 3,995,174 | 11/1976 | Zrudsky | 307/584 X |
| 4,600,816 | 7/1986 | McDermott | 333/81 R X |

FOREIGN PATENT DOCUMENTS 148706  7/1985  European Pat. Off. .......... 333/81 R

Primary Examiner—Paul Gensler
Attorney, Agent, or Firm—Antonelli, Terry & Wands

[57] ABSTRACT

A monolithic FET bridge attenuator contains four single gate FETs, the source-drain path of each of which forms a respective arm of the bridge. The attenuation control electrodes (gates) of the FETs in opposite arms of the bridge are connected to a common control voltage. A first pair of diagonally opposing nodes of the bridge are coupled to receive respective input signals that differ in phase by 180°. A second pair of diagonally opposing nodes of the bridge disposed between the first pair of nodes provide a pair of output signals differing in phase by 180°. In effect, each FET has the electrical behavior of a parallel RC circuit, the resistive component of which is controlled by the gate voltage.

9 Claims, 2 Drawing Sheets

MONOLITHIC FET BRIDGE ATTENUATOR

FIELD OF THE INVENTION

The present invention relates to communication systems and is particularly directed to a monolithic field effect transistor bridge attenuator having effectively constant phase shift over a prescribed range of attenuation.

BACKGROUND OF THE INVENTION

Adaptive signal processing systems, such as adaptive array antennas, may employ several thousand complex weights for steering an antenna beam (or beams). In microwave communication systems, in which a number of different elements are combined to meet the functional demands of the system, component fabrication has taken the form of monolithic microwave integrated circuits (MMICs) which offer low cost, miniaturization and high reliability. In such circuits, semiconductor material such as gallium arsenide, indium phosphide and other III-V components make it possible to integrate a large number of signal processing elements to meet the needs of the system. One type of signal processing component which has enjoyed use in complex weight networks in such systems is the field effect transistor. Typically the application of FETs to attenuator networks has involved dual-gate FETs as variable gain elements or single-gate FETs arranged in conventional "L", "T", and "PI" configurations. Now although these FET attenuator circuits are capable of providing a substantial degree of controlled attenuation of an input signal, they also introduce a significant phase shift. As a result such devices are not practically suited for a number of signal processing applications, such as adaptive null steering array systems, wherein the null depth is limited by the phase shift variation versus attenuation in the complex weight.

SUMMARY OF THE INVENTION

In accordance with the present invention, the inability of conventional FET attenuator devices to provide a substantial range of attenuation with minimal phase shift thereover is achieved by an attenuator configuration in which respective FETs are arranged in the respective arms of a bridge network. Because of the inherently balanced nature of the bridge network there is effectively no or only minimal phase shift through the attenuator, over a substantial attenuation range (e.g. on the order of 30–40 dB).

In its actual configuration, the bridge contains four single gate FETs, the source-drain path of each of which forms a respective arm of the bridge. The attenuation control electrodes (gates) of the FETs in opposite arms of the bridge are connected to a common control voltage. A first pair of diagonally opposing nodes of the bridge are coupled to receive respective input signals that differ in phase by 180°. A second pair of diagonally opposing nodes of the bridge disposed between the first pair of nodes provide a pair of output signals differing in phase by 180°. In effect, each FET has the electrical behavior of a parallel RC circuit, the resistance component of which is controlled by the gate voltage. Except for a resistance control voltage applied to the gates of the field effect transistors, D.C. voltage is applied to the field effect transistors of the bridge so that none of the transistors draws D.C. current. Because the FET bridge attenuator network of the present invention enjoys effectively no, or only minimal, phase shift over a wide range of attenuation, it is particularly useful in an adaptive array antenna system where constant phase attenuators are required for providing deep nulls and a low complexity signal processing mechanism.

DETAILED DESCRIPTION

Figure 1:
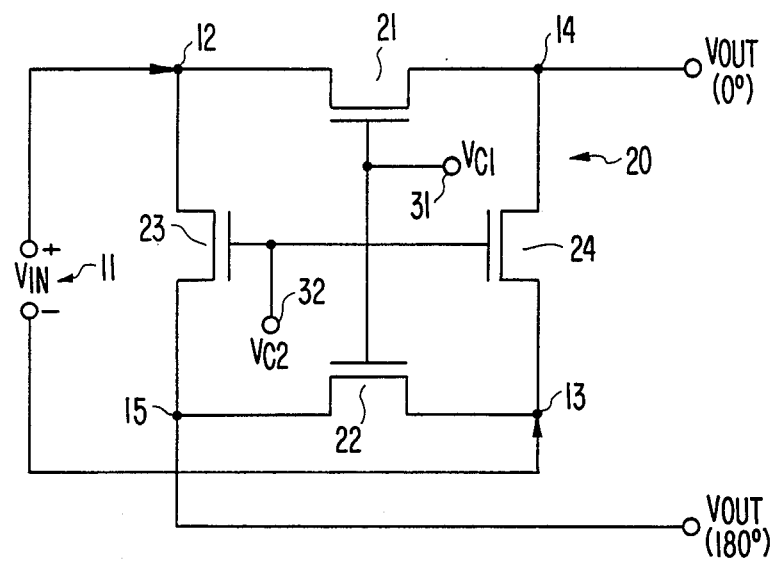
FIG. 1 is a schematic diagram of an FET bridge attenuator in accordance with the present invention.

Referring now to FIG. 1, there is shown a field effect transistor bridge attenuator network in accordance with the present invention which comprises a pair of input terminals 12 and 13 and a pair of output terminals 14 and 15. Input signals to the bridge are represented by a voltage source 11, the differential outputs of which are coupled to input terminals 12 and 13. Implicit in the signals supplied to terminals 12 and 13 by voltage source 11 is a phase difference of 180° across the source. (In the Figures, source 11 and the arms of the bridge 20 are referenced to a prescribed potential (e.g. ground), not shown so as to simplify the drawings.)

The bridge itself is comprised of a first field effect transistor 21 the source-drain path of which is coupled in series between input terminal 12 and output terminal 14 and the gate (control) electrode of which is coupled to a first control input terminal 31 for receiving a first control voltage $V_{C1}$. A second arm of the bridge is comprised of a field effect transistor 22, the source drain-path of which is coupled in series between input terminal 13 and output terminal 15 and the gate electrode of which is coupled to control terminal 31.

A third arm of the bridge is comprised of field effect transistor 23, the source-drain path of which is coupled in series between output terminal 15 and input terminal 12 and the gate electrode of which is coupled to control terminal 32 for receiving a second control voltage $V_{C2}$. Finally, a fourth arm of the bridge is comprised of field effect transistor 24, the source-drain path of which is coupled in series between output terminal 14 and input terminal 13 and the gate electrode of which is coupled to control terminal 32 for receiving the second control voltage $V_{C2}$. Except for the D.C. control voltages $V_{C1}$ and $V_{C2}$, applied to the gates of field effect transistors 21–24, as shown in FIG. 1, no D.C. bias voltage is applied to the arms of the bridge so that none of transistors 21–24 draws D.C. current.

In terms of a practical embodiment, each of field effect transistors 21–24 is preferably disposed in a monolithic semiconductor substrate as part of a monolithic microwave integrated circuit with minimal lead lengths for minimizing signal coupling inductance and added capacitance.

Figure 2:
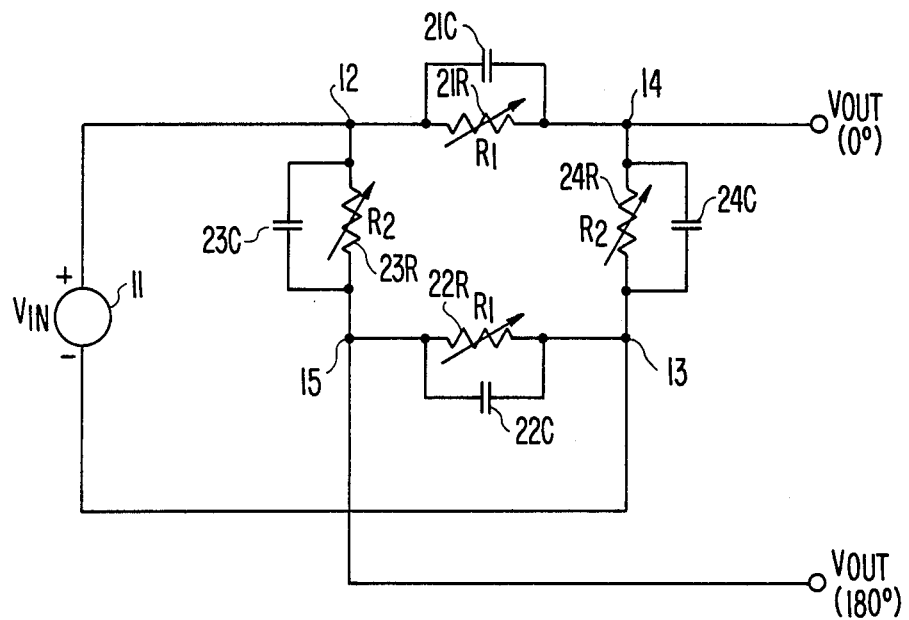
FIG. 2 is an equivalent circuit diagram for explaining the electrical characteristics of the FET bridge attenuator of FIG. 1.

To facilitate an understanding of the operation of the circuit of FIG. 1, attention is directed to FIG. 2 which shows an equivalent circuit diagram of the bridge network of FIG. 1. As shown in FIG. 2, each respective field effect transistor is comprised of a parallel connection of a capacitor and a variable resistor. The values of the capacitors are established by the electronic characteristics of the respective field effect transistors and are assumed to be constant. In a preferred embodiment, each field effect transistor, being integrated in a common monolithic integrated circuit, has effectively the same geometry characteristics so that an acceptable tolerance of electrical/electronic parameters is established.

In FIG. 2, field effect transistor 21 is represented by parallel connection of capacitor 21C and variable resistance 21R, denoted in the Figure as having a resistance value $R_1$. Similarly, field effect transistor 22, the gate electrode of which is connected in common with the gate electrode of field effect transistor 21 to receive the same control voltage $V_{C1}$, is comprised of a variable resistor 22R (having resistance value $R_1$) and a capacitor 22C, connected in parallel therewith.

Field effect transistor 23, which is coupled between input terminal 12 and output terminal 15, is comprised of a variable resistor 23R and a capacitor 23C connected in parallel therewith. The resistance value of resistor 23R is shown in FIG. 2 as $R_2$. Similarly, field effect transistor 24, which is connected between input terminal terminal 13 and output terminal 14, is comprised of a variable resistor 24R and a capacitor 24C, connected in parallel therewith. Like resistor 23R, the value of resistor 24R is denoted in FIG. 3 as a resistor $R_2$.

With the configuration shown in FIG. 2, it can be seen that the bridge network of the present invention is effectively balanced. In order to maintain this network balanced and be able to vary the attenuation through the circuit, without effectively any significant degree of phase change, the capacitors 21C-24C are equal and the resistors in opposite legs of the bridge are equal (namely resistors 21R and 22R have equal values $R_1$, while resistors 24R and 23R have equal values $R_2$, as noted above). Moreover, changes in these resistance values of the opposite arms of the bridge occur together so as to maintain the electrical balance of the bridge.

For a typical 300 micron gate width and one micron gate length FET, the drain-to-source resistance varies over a range from about 30 ohms to 300 ohms as the gate-source voltage is varied over a range of from zero volts DC to $-2.0$ volts DC. The drain-to-source capacitance of each of the field effect transistors, denoted by capacitors 21C-24C in FIG. 2, has a value on the order of about 0.2 pF.

Using straightforward circuit analysis, the attenuation and phase variation of the bridge network of FIG. 2 can be derived by calculating the transfer function. Using the capacitor and resistor notations of the equivalent circuit diagram of FIG. 2, one obtains a phase value:

$$\phi(j\omega) = -Arctan\ [2\omega CR_1R_2/(R_1+R_2)] \quad (1)$$

and a transfer function magnitude (attenuation definition)

$$|H(j\omega)| = \{[(R_2^2 - R_1^2)^2 + (2\omega CR_1R_2(R_1-R_2))^2]^{\frac{1}{2}}/[(R_1+R_2)^2 + (2\omega CR_1R_2)^2]\}/2 \quad (2)$$

At a frequency of 1,400 MHz, the above relationships reveal a substantial variation in attenuation with only a minimal phase change when the effective resistance $R_2$ in field effect transistors 23 and 24 is varied over an order of magnitude while the effective resistance of field effect transistors 21 and 22 is maintained at the above mentioned 30 ohm value. Specifically, a variation of resistance $R_2$ between 31 and 331 ohms yields a phase variation between $-3.07°$ and $-5.53°$ while the attenuation ($20log_{10}|H(j\omega)|$) varies between $-41.7$ dB and $-7.6$ dB.

Figure 3:
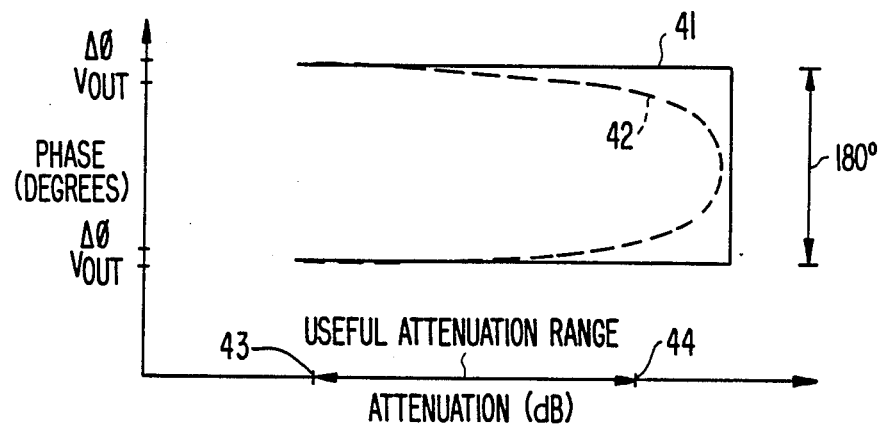
FIG. 3 is a graphic plot of phase vs. attenuation of the FET bridge attenuator of FIG. 1.

If resistor $R_2$ is maintained at 30 ohms and $R_1$ is varied between 31 and 331 ohms, the phase variation and attenuation will be the same; however, a 180° phase shift will occur at the output. A graphical representation of the variation of phase with attenuation of a balanced FET bridge attenuator in accordance with the present invention is shown in FIG. 3. Ideally, the attenuation follows solid line characteristic 41 between a minimum attenuation value 43 and a maximum attenuation value 44, beyond which there is a 180° phase shift between the two voltage values at terminals 14 and 15, as shown. In actuality, however, because of a minor change in the capacitance of the field effect transistors (due to depletion region spread in response to applied gate voltage), interelectrode capacitance, etc. there is a small variable capacitive component, so that the actual curve, shown as broken line characteristic 42 in FIG. 3, departs slightly from the ideal characteristic 41. However, over a substantial range of attenuation (in the neighborhood of 40 dB) the absolute value of phase change at each of output terminals 14 and 15 is extremely small (less than five degrees) so that the bridge attenuator is particularly suited for use in complex weight applications such as in adaptive array antennas, mentioned above.

Operation of the circuit of the invention is such that maximum attenuation is reached when the same control voltage is applied to each of control terminals 31 and 32 of the bridge network shown in FIG. 1 (namely $V_{C1} = V_{C2}$). For a differential between these two voltages, the attenuation is decreased.

As noted above the circuit configuration shown in FIG. 1, bias resistors for providing return to ground for operation of the respective transistors are not shown in order to simplify the drawing. It is also important to maintain a balance in amplitude level at each of input terminals 12 and 13, as well as the required 180° phase shift therebetween to insure maximum effective operation of the circuit. As pointed out above, in a practical realization of the circuit, wire bond lengths for providing signal connections to the monolithic integrated circuit structure should be equalized to minimize both inductive and capacitance imbalance and thereby achieve amplitude balance and maintain the 180° phase differential between input terminals 12 and 13.

Figure 4:
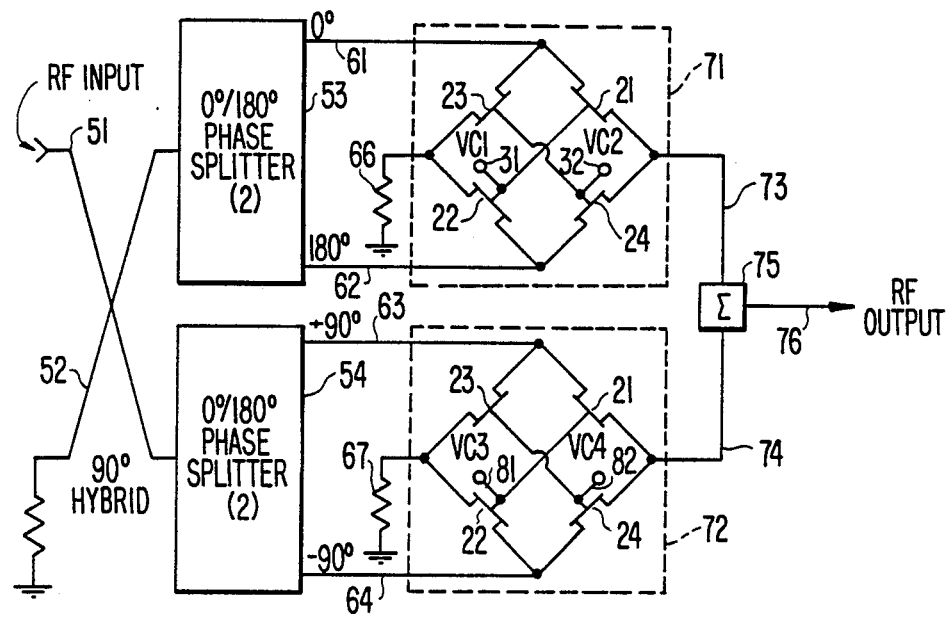
FIG. 4 shows a complex weight device employing the FET bridge attenuator of FIG. 1.

FIG. 4 illustrates an example of the application of the invention to a complex weight device such as may be used in a steerable antenna system. An incoming RF signal of interest is coupled to a 0/90° hybrid circuit comprised of a pair of coupling links 51 and 52, one end of link 51 being coupled to receive an RF input signal, while one end of link 52 is coupled to a reference potential (ground). The other end of link 51 is coupled to a 0°/180° phase splitter 54, while the other end of link 52 is coupled a 0°/180° phase splitter 53, to produce four quadrature vector signals (0°, 180°, +90°, −90°) on links 61, 62, 63 and 64, as shown. These quadrature vector signals are coupled to FET bridge attenuator circuits 71 and 72, each of which is of the type shown in FIG. 1, described above. In attenuator circuit 71, vector signal links 61 and 62 are coupled to a first pair of nodes of the bridge while the opposite nodes respectively are coupled to ground through impedance 66 and to output link 73, as shown. Respective control voltages $V_{C1}$ and $V_{C2}$ are coupled to control terminals 31 and 32 of the bridge, just as in the configuration shown in FIG. 1.

In attenuator circuit 72, the control voltages are shown as being respectively different from those applied to attenuator 71, namely, denoted as control voltages $V_{C3}$ and $V_{C4}$ coupled to control terminals 81 and 82, as shown. Input links 63 and 64, having a phase difference of 180° therebetween, are coupled to opposite nodes of the bridge, while the other pair of nodes are coupled through impedance 67 to a reference potential (ground) and output link 74. By setting the control voltages of each respective bridge attenuator, the desired degree of attenuation for the respective quadrature vectors on links 61-64 may be achieved. The output links 73 and 74 are summed in summing circuit 75 to provide a controlled amplitude/phase output on link 76.

As will be appreciated from the foregoing description, the shortcomings of conventional FET attenuator circuits which introduce phase shift into the signal being attenuated are circumvented by a balanced bridge configuration of field effect transistors that provide a substantial range of attenuation over an effectively minimized degree of phase change. Advantageously, because the FET bridge attenuator can be implemented in a monolithic microwave integrated circuit, it enjoys application to a wide variety of present day communication circuits including those employed in complex adaptive signal processing environments, such as steerable antenna arrays.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A signal coupling circuit comprising:
   first and second input terminals;
   first and second output terminals; and
   a bridge circuit respective arms of which contain field effect transistors effectively operating as controllable resistances, the resistance values of source-drain paths of which are continuously variable over a prescribed range, coupled between said first and second input terminals and said first and second output terminals, and having control electrodes coupled to control terminals for receiving control voltages for controlling the values of the effective resistances thereof at resistance values lying within said range of continuously variable resistance; and wherein
   said bridge circuit comprises a first field effect transistor the source-drain path of which is coupled between said first input terminal and said first output terminal and the gate electrode of which is coupled to receive a first control voltage, a second field effect transistor the source-drain path of which is coupled between said second input terminal and said second output terminal and the gate electrode of which is coupled to receive said first control voltage, a third field effect transistor the source-drain path of which is coupled between said first input terminal and second output terminal and the gate electrode of which is coupled to receive a second control voltage, and a fourth field effect transistor the source-drain path of which is coupled between said second input terminal and said first output terminal and the gate electrode of which is coupled to receive said second control voltage.

2. A signal coupling circuit according to claim 1, wherein said first and second control voltages are equal to each other.

3. A signal coupling circuit according to claim 1, wherein said first and second input terminals are coupled to receive, respectively, first and second signals of a prescribed frequency and having an effective phase difference therebetween of 180°.

4. A signal coupling circuit according to claim 3, wherein the amplitudes of said first and second signals are effectively coequal.

5. For use in a microwave signal processing network wherein an input signal is coupled to a plurality of weighting devices and subjected to a controlled amplitude modification by a control signal applied thereto, the outputs of said weighting devices being combined with one another, a respective one of said devices comprising:
   first and second input terminals respectively adapted to receive said input signal and the inverse of said input signal;
   first and second output terminals, one of which corresponds to the output of said respective weighting device; and
   a bridge circuit respective arms of which contain field effect transistors effectively operating as controlled resistances, the resistance values of source-drain paths of which are continuously variable over a prescribed range, coupled between said first and second input terminals and said first and second output terminals, and having control electrodes coupled to control terminals for a receiving control voltages for controlling the values of the effective resistances thereof at resistance values lying within said range of continuously variable resistance, and wherein said bridge circuit comprises a first field effect transistor the source-drain path of which is coupled bewen said first input termnal and said first output terminal and the gate electrode of which is coupled to receive a first control voltage, a second field effect transistor the source-drain path of which is coupled between said second input terminal and said second output terminal and the gate electrode of which is coupled to receive said first control voltage, a third field effect transistor the source-drain path of which is coupled between said first input terminal and second output terminal and the gate electrode of which is coupled to receive a second control voltage, and a fourth field effect transistor the source-drain path of which is coupled between said second input terminal and said first output terminal and the gate electrode of which is coupled to receive said second control voltage.

6. A device according to claim 5, wherein said first and second control voltages are equal to each other.

7. A device according to claim 5, wherein said first and second input terminals are coupled to receive, respectively, first and second signals of a prescribed frequency and having an effective phase difference therebetween of 180°.

8. A device according to claim 7, wherein the amplitudes of said first and second signals are effectively coequal.

9. A method of controlling the amplitude of a signal over a prescribed range of amplitude variation with effectively minimal change in the phase thereof comprising the steps of:

(a) applying said signal to a first input terminal and the inverse of said signal to a second input terminal;

(b) coupling a bridge circuit between said first and second input terminals and first and second output terminals, said bridge circuit having respective arms containing field effect transistors effectively operating as controlled resistances, the resistance values of source-drain paths of which are continuously variable over a prescribed range, coupled between said first and second input terminals and said first and second output terminals the gate electrodes of said field effect transistors being coupled to receive control voltages for controlling the effective resistances of the source-drain paths thereof and thereby the amplitudes of the resultant signals obtained at said first and second output terminals, said bridge circuit comprising a first field effect transistor the source-drain path of which is coupled between said first input terminal and said first output terminal and the gate electrode of which is coupled to receive a first control voltage, a second field effect transistor and the source-drain path of which is coupled between said second input terminal and said second output terminal and the gate electrode of which is coupled to receive said first control voltage, a third field effect transistor the source-drain path of which is coupled between said first input terminal and second output terminal and the gate electrode of which is coupled to receive a second control voltage, and a fourth field effect transistor the source-drain path of which is coupled between said second input terminal and said first output terminal and the gate electrode of which is coupled to receive said second control voltage.

* * * * *